(12) United States Patent
Adolfsson et al.

(10) Patent No.: US 11,039,195 B2
(45) Date of Patent: Jun. 15, 2021

(54) CABLE FOR CONNECTING AN IMAGE DISPLAYING DEVICE TO A DIGITAL COMPUTER NETWORK

(71) Applicant: INNSPIRE INTELLIGENT HOTELS AB, Stockholm (SE)

(72) Inventors: Mathias Adolfsson, Tyreso (SE); Martin Chevalley, Stockholm (SE)

(73) Assignee: INNSPIRE INTELLIGENT HOTELS AB, Stockholm (SE)

( * ) Notice: Subject to any disclaimer, the term of this patent is extended or adjusted under 35 U.S.C. 154(b) by 6 days.

(21) Appl. No.: 16/624,953

(22) PCT Filed: Jun. 25, 2018

(86) PCT No.: PCT/SE2018/050681
§ 371 (c)(1),
(2) Date: Dec. 20, 2019

(87) PCT Pub. No.: WO2019/004907
PCT Pub. Date: Jan. 3, 2019

(65) Prior Publication Data
US 2020/0145711 A1    May 7, 2020

(30) Foreign Application Priority Data
Jun. 26, 2017 (SE) .................................. 1750818-5

(51) Int. Cl.
*G06F 3/14* (2006.01)
*H04N 21/414* (2011.01)
(Continued)

(52) U.S. Cl.
CPC ......... *H04N 21/414* (2013.01); *G06F 3/1431* (2013.01); *H04B 5/0031* (2013.01); *H04W 4/33* (2018.02); *G09G 2370/20* (2013.01)

(58) Field of Classification Search
CPC . G06F 30/34; G06F 3/1431; G09G 2370/025; G09G 2370/16; G09G 2370/20; H04B 5/0031; H04N 21/414; H04W 4/33
(Continued)

(56) References Cited

U.S. PATENT DOCUMENTS 10,855,920 B1 * 12/2020 Shih .................... H02M 3/1582
2008/0120668 A1    5/2008 You
(Continued)

FOREIGN PATENT DOCUMENTS

CN    203968281 U    11/2014
EP    2360613 A1    8/2011
(Continued)

OTHER PUBLICATIONS

International Search Report from corresponding International Patent Application No. PCT/SE2018/050681, dated Sep. 26, 2018, 5 pages.
(Continued)

*Primary Examiner* — Tony O Davis
(74) *Attorney, Agent, or Firm* — Tucker Ellis LLP

(57) ABSTRACT

Cable (200) for connecting an image displaying device (133) to a digital computer network (120), which cable (200) comprises only a first end (201), arranged to receive a digital network signal, and a second end (202), arranged to be connected to the image displaying device (133) and deliver a digital image signal to the image displaying device (133). The invention is characterised in that the cable (200) comprises an integrated general-purpose programmable computer device (203), arranged to execute a piece of cable computer software in turn arranged to read the network signal and produce said image signal using the said network signal, in that the computer device (203) is arranged to be powered by a voltage provided by an ethernet socket (121)
(Continued)

to which the first end (201) is arranged to be physically connected or by an image signal receiving socket to which the second end (202) is arranged to be physically connected, in that the cable (200) further comprises a connection (220) for a separate serial communication cable (221), and in that the computer device (203) is arranged to produce control signals for controlling said image displaying device (133) and to provide such signals on said connection (220). The invention also relates to a method.

16 Claims, 2 Drawing Sheets

(51) Int. Cl.
  *H04W 4/33*   (2018.01)
  *H04B 5/00*   (2006.01)

(58) Field of Classification Search
  USPC ..................... 455/41.2; 345/156, 690–696
  See application file for complete search history.

(56) References Cited

U.S. PATENT DOCUMENTS

| | | |
|---|---|---|
| 2009/0228946 A1 | 9/2009 | Perlman |
| 2009/0247082 A1* | 10/2009 | Sathath ................ G06F 1/1616 |
| | | 455/41.2 |
| 2010/0056073 A1 | 3/2010 | Leung |
| 2011/0261269 A1 | 10/2011 | Khan |
| 2013/0214902 A1 | 8/2013 | Pineau |
| 2013/0346564 A1 | 12/2013 | Warrick |
| 2014/0364056 A1 | 12/2014 | Belk |
| 2019/0235816 A1* | 8/2019 | Adolfsson ............. G06F 3/0488 |
| 2019/0361834 A1* | 11/2019 | Shih ........................ H04L 12/10 |
| 2020/0145711 A1* | 5/2020 | Adolfsson ............... H04W 4/33 |

FOREIGN PATENT DOCUMENTS

| | | | |
|---|---|---|---|
| GB | 2402007 A | 11/2004 | |
| JP | S62154850 A | 7/1987 | |
| JP | H1173174 A | 3/1999 | |
| JP | 2009159313 A | 7/2009 | |
| KR | 101183326 B1 | 9/2012 | |
| WO | 2014143171 A1 | 9/2014 | |

OTHER PUBLICATIONS

International Preliminary Report on Patentability from corresponding International Patent Application No. PCT/SE2018/050681, completed May 27, 2019, 14 pages.

* cited by examiner

CABLE FOR CONNECTING AN IMAGE DISPLAYING DEVICE TO A DIGITAL COMPUTER NETWORK

The present invention relates to a cable for connecting an image displaying device to a digital computer network. In particular, the present invention relates to such a cable for use in spaces for temporary use by identified guests, such as in hotels, conference premises and similar, and for providing personalized user interfaces on such image displaying devices.

It is presently common that such spaces feature image displaying devices for personalized use by identified guests. Examples comprise monitors or television sets in hotel rooms, via which guests can order room service; find information; interact with booking systems; and obtain other personal services. Typically, such interaction takes place in communication with a PMS (Property Management System), or similar. Therefore, it is necessary to connect the image displaying device to the premise's network.

This has conventionally been achieved using a set-top box or similar, connected to the image displaying device. Prior art solutions rely on hardware and software based solutions perceived as complex and cumbersome to use.

The prior art further comprises documents CN 203968281 U, GB 2402007 A, KR 101183326 B1, US 2008120668 A1 and US 20100056073 A1.

There is also a problem using such conventional solutions, since used set-top boxes and similar must be installed for each image displaying device to be used with the system, which may be complicated. Such peripheral equipment not only uses valuable space, it also makes a cluttered impression. Moreover, peripheral devices such as set-top boxes require additional power.

Furthermore, there is a need for a simpler way for users to interact with such systems, via connected image displaying devices in such spaces.

The present invention solves the above described problems.

Hence, the invention relates to a cable for connecting an image displaying device to a digital computer network, which cable comprises only a first end, arranged to receive a digital network signal, and a second end, arranged to be connected to the image displaying device and deliver a digital image signal to the image displaying device, which cable is characterised in that the cable comprises an integrated general-purpose programmable computer device, arranged to execute a piece of cable computer software in turn arranged to read the network signal and produce said image signal using the said network signal, in that the computer device is arranged to be powered by a voltage provided by an ethernet socket to which the first end is arranged to be physically connected, in that the cable further comprises a connection for a separate serial communication cable, and in that the computer device is arranged to produce control signals for controlling said image displaying device and to provide such signals on said connection.

Further, the invention relates to a method for connecting an image displaying device to a digital computer network, which method is characterised in that the method comprises the steps a) providing a cable, which cable comprises only a first end, arranged to receive a digital network signal, and a second end, arranged to be connected to the image displaying device and to deliver a digital image signal to the image displaying device, the cable comprising an integrated general-purpose programmable computer device, arranged to execute a piece of cable computer software in turn arranged to read the network signal and produce said image signal using the said network signal, the computer device being arranged to be powered by a voltage provided by an ethernet socket to which the first end is arranged to be physically connected; the cable further comprising a serial connection for a serial communication cable, the computer device being arranged to produce control signals for controlling said image displaying device and to provide such signals on said connection; b) connecting the first end of the cable to the digital network; c) connecting the second end of the cable to the image displaying device; d) providing a serial communication cable; e) connecting a first end of the serial communication cable to the said serial connection of the cable; and f) connecting a second end of the serial communication cable to the image displaying device.

In the following, the invention will be described in detail, with reference to exemplifying embodiments of the invention and to the enclosed drawings, wherein.

Figure 1:
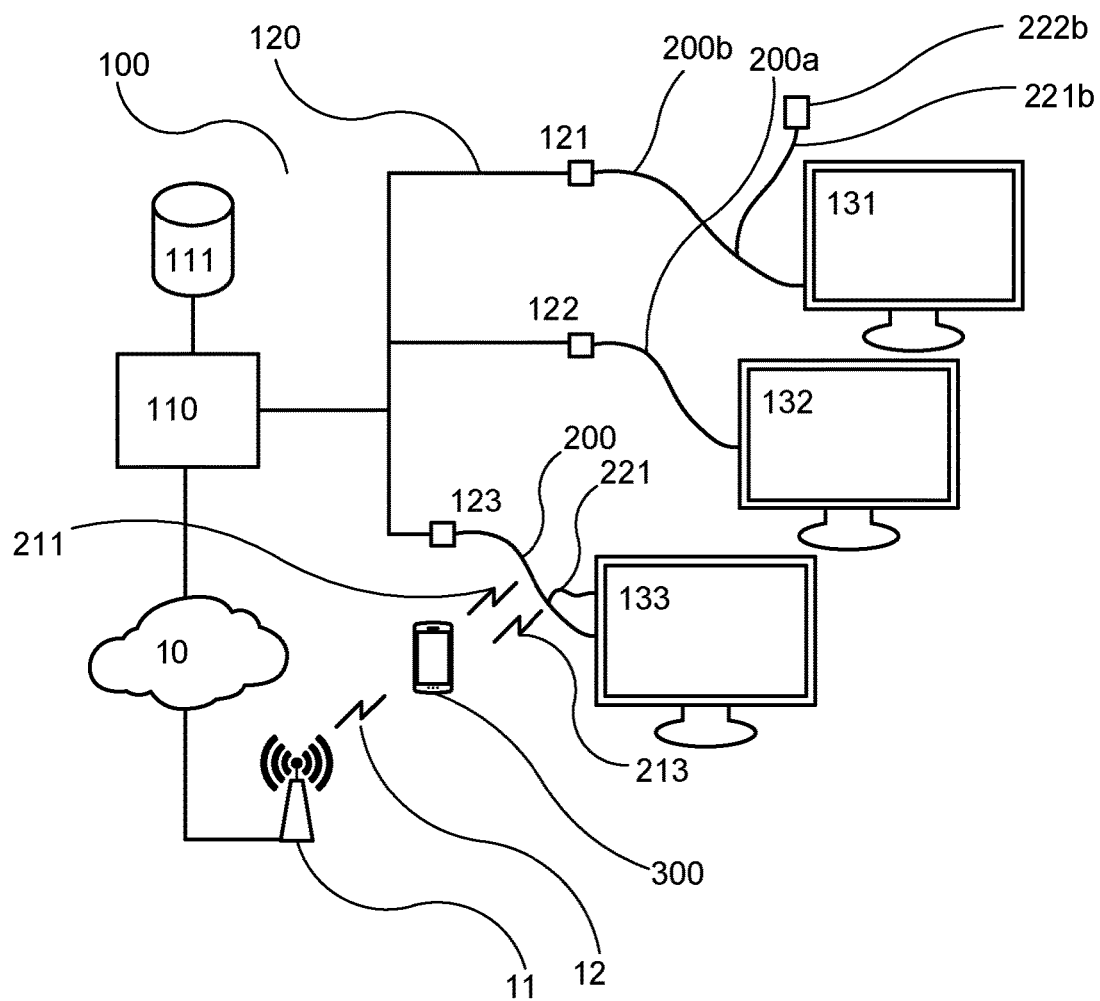
FIG. 1 is an overview diagram of a system in which a cable according to the present invention may be used.

All figures share the same set of reference numerals.

Hence, FIG. 1 illustrates a system 100 in which a cable 200, 200a, 200b according to the invention may be used as a part component, for connecting a respective image displaying device 131, 132, 133 to a digital computer network 120, in particular to a respective network connection socket 121, 122, 123 (such as an ethernet socket) of such a network 120.

Herein, an "image displaying device" may refer to a normal television set, a monitor, a projector or any other piece of equipment capable of passively displaying image material to a user, based upon an image signal. It is preferable that the image displaying device is not a general-purpose programmable device such as a conventional computer or a tablet computer. Herein, the term "general-purpose programmable device" refers to a device which may be programmable in a general manner, for general purposes, using an available interface for loading arbitrary computer software into to the device for execution therein. Such a general-purpose programmable device is also referred to herein as a "general purpose computer", and typically comprises a processor, a memory, a bus and peripheral digital communication means. It is noted that a television set may comprise a programmed computer without being generally-purpose programmable as such, if it does not offer such an interface for loading software.

The network 120 is also connected to a PMS (Property Management System) 110, in communication with or comprising a database 111. In a preferred embodiment, the network 120 and the PMS 110, as well as the devices 131, 1332, 133 and the cables 200, 200a, 200b are all installed as component parts of the system 100 in a particular property for the purpose of serving identified guests with services in relation to a visit or other activity in the property in question. Preferred examples of such properties comprise hotels and conference venues.

FIG. 1 also illustrates a wireless access point 11, such as a WiFi access point or a mobile communication base station, such as a 3G or 4G base station, which is connected via the internet 10 for serving mobile users with mobile internet connectivity 12. The PMS 110 is also connected to the internet 10. Normally, a WiFi access point is used when a connected portable electronic device is on the premises of the said property; while a mobile communication base station is normally used when no such WiFi access point is available.

Figure 2:
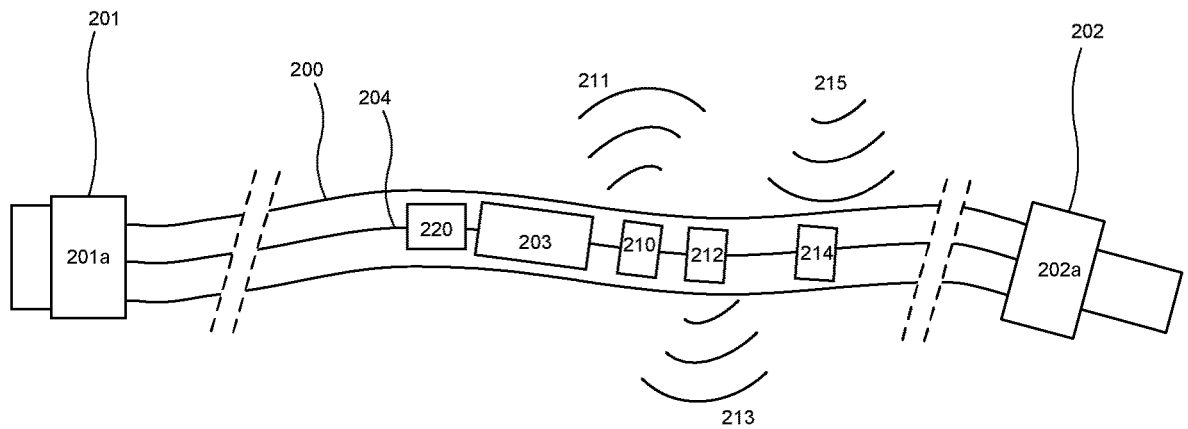
FIG. 2 is a simplified view of a cable according to the present invention.

FIG. 2 illustrates the cable 200 according to the invention, shown in an installed state in FIG. 1 together with other installed cables 200a, 200b of the same type. The cable 200 is arranged and specifically adapted for connecting the image displaying device 133 to the digital computer network 120. That the cable 200 is arranged "for connecting" the image displaying device 133 to the network 120 means that the cable 200 is arranged to provide a connection, for the image displaying device 133, to the network 120 in question. In a first preferred embodiment, this means that the image displaying device 133 is provided with a direct connection, preferably a digital connection, to the network 120. For instance, in case the network 120 is a packet network such as an internet connected IP-based intranet, the image displaying device 133 may be provided with an IP connection, such as an internet connection, by the cable 200, which may be used by the image displaying device 133 itself to communicate directly with other internet connected devices on the network 120 or even remotely connected devices. In a second preferred embodiment, this means that the image displaying device 133 is only indirectly connected to the network 120 using the cable 200, so that the image displaying device 133 is a recipient of the image signal described below from the cable 200, without being able to transmit any information back to the network 120. In the latter case, the image signal is still digital but may even be an analogue image-carrying signal.

The cable 200 comprises only a first end 201, arranged to receive a digital network 120 signal from the network 120 to which the cable 200 is connected, and a second end 202, arranged to be connected to the image displaying device 133 and to deliver a digital image signal to the image displaying device 133. That the cable 200 only comprises said first 201 and second 202 ends means that the cable 200 is in the form of an elongated two-ended structure with the general shape of a cable. In other words, the cable 200 does not comprise any additional blind or connected cable segments with additional ends, or additional contacts or connectors, apart from the said ends 201, 202 with their respective contacts 201a, 202a (see below). In particular, the cable 200 is preferably designed as one single piece of hardware, not comprising any detachable boxes or other parts with connectors, to which cable segments can be connected or disconnected to assemble or disassemble the cable 200.

According to the invention, the cable 200 further comprises an integrated general-purpose programmable (as defined above) computer device 203, arranged to execute a piece of computer software in turn arranged to read the said network 120 signal and to produce said image signal using the said network 120 signal. That the image signal is produced "using" the network 120 signal means that the image signal is calculated at least to some extent based upon data carried by the network 120 signal, so that the information displayed by the image displaying device 133 based upon or coded by the said image signal reflects the information provided in the image signal in a way which is recognizable by a human viewer of the image displaying device 133. Preferably, the determination of the image signal based upon the network 120 signal involves data processing in at least some respect, and does preferably not only involve simply forwarding or format converting an existing image or video signal carried by the network 120 signal. Hence, it is preferred that the cognitive contents of the image carried by the image signal is created, such as put together from several information sources, by the computer device 203. One or several such information sources may be data carried by the network 120 signal (such as from different original sources och relating to different aspects of the image signal to be produced) while another information source may be information already existing in the computer device 203.

According to the invention, the computer device 203, as well as preferably all other electrically powered hardware features of the cable 200, is arranged to be powered by a voltage provided by an ethernet socket 123 (such as via PoE, Power over Ethernet, or a similar solution, whereby a voltage provided by the socket 123 is harvested by the cable 200) to which the first end 201 is arranged to be physically connected using connector 201a.

FIG. 2 also indicates one or several conductors 204 arranged within and along the cable 200, physically interconnecting the connectors 201a, 202a with the computer device 203 and other hardware components 210, 212, 214 of the cable 200.

The cable 200 may preferably comprise a plastic coating, and may preferably have the general overall shape of a conventional cable, such as a conventional ethernet or HDMI cable. The plastic coating preferably completely encloses all parts 203, 210, 212, 214 comprised in the cable 200, and its surface is preferably only broken at the connector 201a, 202a attachment points. The cable 200 is preferably between 0.5 and 2 meters long. It is preferably of substantially uniform shape and width along its entire length between said connectors 201a, 202a. It is preferably at the most 1 cm of diameter, preferably along its entire length. Such small cross-sectional dimensions is preferred since the cable 200 can then easily be made self-cooling with respect to comprised electrically powered hardware 203, 210, 212, 214.

Preferably, cable 200 computer software is provided to the computer device 203 upon manufacturing of the cable 200, but preferably the cable 200 computer software can be at least updated using the network 120 signal, in a way which may be conventional as such. In other words, an operating system of the computer device 203 preferably exposes an API (Application Programming Interface) of some type making it possible to, via the network 120 signal, reprogram, update and/or replace said cable 200 software program arranged to produce the image signal.

Preferably, the digital computer network 120 is an IP network, preferably an internet network, and the said network 120 signal is an IP signal, preferably an internet signal. In this case, it is preferred that the image signal defines a web page to be displayed on a screen of the image displaying device 133. Hence, the network 120 signal may, at a particular high-level signal layer, be an HTML protocol signal. In particular, the first end 201 then preferably comprises an ethernet plug 201a.

Similarly, the second end 202 preferably comprises a digital image delivery plug 202a, preferably also arranged to deliver digital sound data, apart from digital image data. A preferred example of such a plug 202a is a conventional HDMI-type (High Definition Media Interface) plug. It is noted, as discussed above, that the plug 202a may be either a mono or (preferably) bi directional communication standard plug.

According to a preferred embodiment, the cable 200 further comprises a wireless internet providing device 210, arranged to accept wireless connections from portable electronic devices 300 in a local neighbourhood of the cable 200 and to provide internet connectivity 211 to such devices (see also FIG. 1). For instance, the device 210 may be a conventional WiFi hotspot. This is preferred since it is then possible to control the access to various functionality (such as the below described preferred examples) provided to users of the interactive user interface described below, since portable electronic devices 300 being provided internet access via the device 210 are then known to be located in the proximity to the cable 200 and therefore to the image viewing device 133.

Hence, it is preferred that the said cable 200 computer software is arranged to produce the image signal so as to produce and present an interactive graphical user interface 140 on the image displaying device 133. An example snapshot of such an interactive graphical user interface 140 is illustrated in FIG. 3 on a screen of the image displaying device 133.

Figure 3:
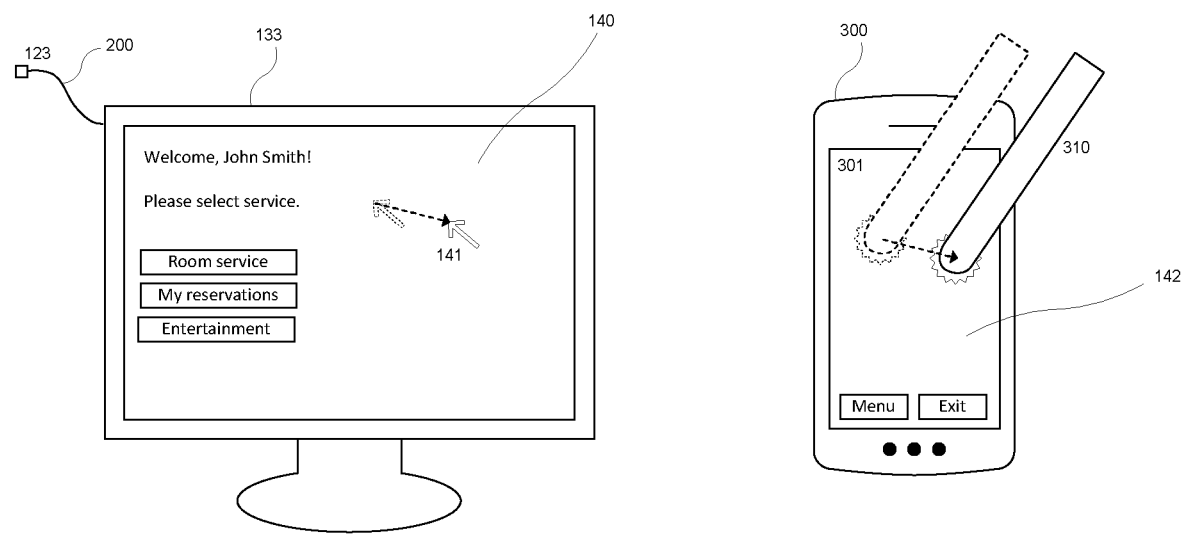
FIG. 3 is a sample snapshot image of an interactive graphical user interface displayed on an image displaying device connected to a cable according to the present invention, in conjunction with an interactive user interface on a portable electronic device.

As seen in FIG. 3, the graphical user interface 140 is preferably individualized, in the sense that it is specifically adapted for serving the particular individual user controlling and interacting with the interface 140, for instance using a remote control or the portable electronic device 300 as described herein. Preferably, the user is identified as discussed below via the portable electronic device 300. In FIG. 3, the user is a particular individual named "John Smith". The exemplifying options "Room service", "My reservations" and "Entertainment" illustrated in the interface 140 shown in FIG. 3 are relevant to the preferred field of use for the system 100 of hotel information systems, and are preferably selected based upon the identity of the said user. For instance, the option "My reservations" may only be available in case John Smith currently has pending reservations as indicated in the PMS 110.

According to one preferred embodiment, the user interface 140 is arranged to be controlled by a remote control (not shown in the figures), arranged to emit wireless signals that may be conventional as such, for instance infrared radio signals 215. Such emitted signals 215 are then captured by a wireless signal detection means 214 comprised in the cable 200 and fed to the computer device 203 and processed by said cable 200 computer software, so as to control the image signal and as a result the interface 140 in a way making the user experience for a user controlling the remote control interactive. For instance, the remote control may feature arrow buttons using which the user can navigate between different graphically presented functionality in the interface 140, and a selection button using which the user may acknowledge specific selections of such functionality.

However, in a preferred embodiment, which may or may not be combined with remote control functionality 214 of the said type, the cable 200 computer software executed on the computer device 203 is arranged to receive, via said network 120 connection, control signals arranged to interactively control the interactive user interface 140, and specifically to update the interactive user interface 140 in reaction to such control signals. This embodiment is the one which is illustrated, for exemplifying purposes, in FIG. 3.

In particular, in this case it is preferred that the said control signals are initiated by a device 300 computer software executed by or from a portable electronic device 300, such as a conventional smartphone or the like, which device 300 is preferably located in the proximity of the cable 200 and the connected image displaying device 133, preferably so that a user of the portable device 300 can readily view the interactive graphical user interface 140. Further preferably, the said control signals are preferably produced by said portable device 300 computer software in reaction, preferably in realtime or near realtime, to a manipulation by said user of a corresponding device 300 user interface 142, preferably an interactive graphical user interface 142, provided by and on the portable device 300. Preferably, the control signals are produced by said portable device 300 software in reaction to and based upon such user manipulation of a touchscreen 301 of the portable electronic device 300. Then, the control signals in question are transferred to the computer device 203 either via the said network 120 (via connector 123 to cable 200) or via a wireless internet connectivity 212 provided to the portable electronic device 300 directly by the cable 200 as described above.

In particular, it is preferred that the said control signals comprise movement descriptors of a graphical pointing means 141, such as an arrow, comprised in the interactive graphical user interface 140. In a very preferred embodiment, the pointing means 141 is directly controlled, via said movement descriptors continuously fed to the computer device 203, which movement descriptors are continuously produced by said portable electronic device 300 computer software in reaction to the user pointing or dragging an object 310, such as the user's finger, on or across the said touchscreen 301 of the portable electronic device 300. This movement of the finger 310 and corresponding (nearly) simultaneous movement of the pointing device 141 is illustrated in FIG. 3 using a broken arrow. This way, the user can use the touchscreen 301 in a way similar to a conventional "track pad" to control the movement pointing device 141. It is also possible to, for instance select objects in the interactive interface 140 by tapping on the touchscreen 301 with the finger 310, whereupon the said portable electronic device 300 software may produce a selection control signal which is communicated to the cable 200 as described above.

In a particularly preferred embodiment (see FIG. 2), the cable 200 comprises a wireless nearfield communication means 212, arranged to be in local wireless contact 213 with the locally arranged (in proximity to the cable 200) portable electronic device 300. For instance, the means 212 may be a Bluetooth®, NFC or ZigBee® communication device. Preferably, the means 212 is arranged to identify devices connected wirelessly thereto, so that the portable electronic device 300 is identified when connected. In particular, the said software executed on computer device 203 is arranged to accept control signals only from portable electronic devices 300 that have previously been identified by the system 100, for instance in said wireless contact with means 212 or by a user registration. It is possible, albeit not preferred, that the local wireless internet connectivity explained above to be provided by means 210 is instead provided by means 212. However, it is preferred that both means 210 and 212 are used, since they serve the different purposes of providing a reliable, high speed internet connectivity and localization-based identification (as described below), respectively.

For instance, the portable electronic device 300 may as such have been preregistered with the system 100, for instance by the user, in a way which may be conventional as such, along with some type of uniquely identifying information pertinent to the portable electronic device 300 itself. One preferred way of performing this registration is that a piece of device 300 computer software is activatable, such as installable, configurable and executable, on or from the portable electronic device 300, which is then preferably a general-purpose programmable device (see above for definition). Such device 300 computer software may provide the above-described user interface 142 on and using the said touchscreen 301. As a part of the activation of the device 300 software, the user of the portable electronic device 300 may be required to sign up for a user account which is then associated with the device 300 as such and used as, comprising or being associated with the above-discussed uniquely identifying information. The uniquely identifying information may, furthermore, be some type of information uniquely tied to the portable electronic device 300 hardware, such as a MAC address of the device 300 or an IMSI or MSISDN number of a SIM card installed in the device 300. The verification of the uniquely identifying information may take part in a way which is conventional as such, for instance as a part of a handshake between the cable 200 software executed on the computer device 203 and the portable electronic device 300 software.

In a preferred embodiment, the cable 200 computer software is arranged to detect (such as automatically or upon initiating contact by the portable electronic device 300, for instance initiated by the said device 300 software), using said nearfield communication means 212 the nearfield, the local presence of a previously identified portable electronic device 300. Then, the cable 200 computer device 203, and in particular the said cable 200 software, is arranged to thereupon automatically impart a predetermined change to the image signal as a response to such presence detection. For instance, by entering a hotel room while carrying a preregistered portable electronic device 300, the local presence of the device 300 is automatically detected by the cable 200 and as a result the personalized interface 140 is automatically displayed on the image displaying device 133 and activated for user interaction by the user carrying the device 300 in question, for instance by automatically activating the interface 142 on the touchscreen 301 as illustrated in FIG. 3.

In particular, it is preferred that the above-described identification of the portable electronic device 300 as such also comprises the identification of a user holding the portable electronic device 300, preferably via a preregistered system 100 user account of the above-discussed type. Then, the said predetermined change of the image signal is determined based upon the identity of the user in question, rather than the device 300 as such.

Such a cable 120 provides a rich, personalized and convenient user experience in a hotel, a conference facility or similar, without requiring a bulky set-top box, complex cabling or similar hardware. All which is required is to connect the cable 200 between a network 120 connection socket 123 and an image signal input socket of the image displaying device 133. The cable 200 may simply replace an internet and/or image cable already existing for the device 133. It is preferred that the cable 200 software is arranged to automatically seek and establish a digital network connection, such as an IP connection with the PMS 110, upon such installation in said socket 123 from which the cable 120 is preferably powered. This provides for a low-maintenance installation which is also aesthetically attractive and which does not negatively affect the interior decoration possibilities of a hotel room or other property facility in which the cable 200 is installed and used.

According to invention, the cable 200 further comprises a connection 220 for a separate serial communication cable 221. Such a serial communication cable 221, which is not permanently attached to, or a part of, the cable 200, but connectable thereto, is shown in two exemplifying embodiments in FIG. 1.

One cable 221 is connected to the cable 200 in one end, and at its other end to the image displaying device 133. This cable 221 is arranged to provide control signals to the image displaying device 133.

Another cable 221b is connected at a first end to the cable 200b and at a second end to an input and/or output IR signal device 222b. The IR signal device 222b is either arranged to emit IR signals carrying control signals to the image displaying device 131 and/or to receive IR signals from a conventional wireless remote control. In case the IR signal device 222b emits IR signals, these signals are provided from the computer device 203 of the cable 200b and provided on the said connection of the cable 200b to the cable 221b. In case the IR signal device 222b receives IR signals, these signals are provided by the cable 221b to the connection 220 of the cable 200b for interpretation and use by the computer device of the cable 200b.

Further according to the invention, the computer device 203 is arranged to produce control signals for controlling the image displaying device, and to provide such signals on said connection 220 (see FIG. 1).

The serial connection cable 221, 221b may be an RS232 or TTL cable, such as is conventional as such. Hence, the connection 220 may be an RS232 or TTL connection, such as a standard 9 PIN RS232 connection according to ITU-T standard V.24.

The computer device 203 is preferably arranged with one, two, three or more functions using the connection 220, to which it is connected.

Firstly, the computer device 203 is arranged to control the image displaying device 133 by sending control signals to the connection 220 and further, via the cable 221, to the image displaying device 133. Such control signals may, for instance, comprise power on/off, volume up/down, as well as brightness up/down or other image quality parameters. Hence, such control signals delivered via cable 221 preferably relate to the image displaying device 133 as such, rather than to the informational contents shown on the image displaying device 133. This is hence a wired connection between the cable 200 and the device 133, via cable 221.

Secondly, the computer device 203 is optionally arranged to send corresponding control signals via cable 221b and IR signal device 222b, for corresponding control of the image displaying device 131 using wireless communication.

Thirdly, the computer device 203 is optionally arranged to receive and interpret, via IR signal device 222b and cable 221b, control signals emitted from a conventional IR remote control. Such control signals may then be used by the computer device 203 to affect the image signal digitally sent to the image displaying device 131 from the cable 200b. For instance, a channel selection input signal from said remote control may be used by the computer device 203 in the cable 200b to change a channel stream currently provided to the image displaying device 131.

In general, the computer device 203 produces and interprets the said control signals based upon a priori knowledge (for instance settable through a user interface) of the type and make of image displaying device 133 and/or remote control used. Preferably, the computer device 203 comprises a set of device-specific control signal tables for this purpose.

Figure 4:
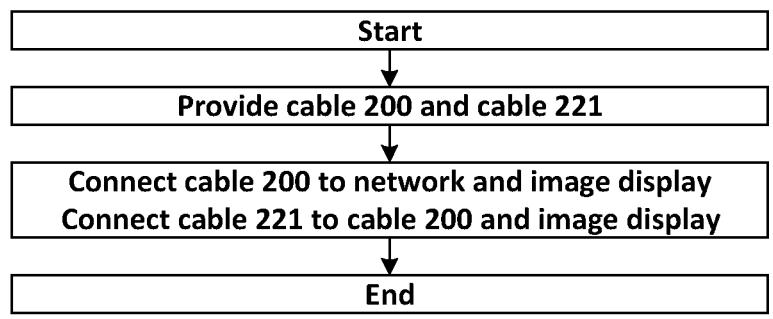
FIG. 4 illustrates a method for connecting an image displaying device to a digital computer network.

A method in accordance to the present invention for connecting an image displaying device 133 to a digital computer network 120 is illustrated in FIG. 4. In a first step, the method starts.

In a subsequent step, a cable 200 of the above described type is provided, including the connection 220 also described above.

In an additional step, the first cable 200 end 201 is connected to the said digital network. Also, the second end 202 of the cable 200 is connected to the image displaying device 133 in question.

In an additional step, the said serial communication cable 221 is provided, and a first end of the serial communication cable 221 is connected to the said serial connection 220 of the cable 200, while a second end of the serial communication cable 221 is connected to the image displaying device 133 in question.

The connection to the image displaying device 133 may be any suitable input connector, such as an RJ12 port, a DB9 port or a RJ45 port, depending on the type and make of image displaying device 133. In general, a GND pin of connector 220 is connected to a GND pin of the image displaying device; a TX pin of connector 220 is connected to a RX pin of the image displaying device; and a RX pin of connector 220 is connected to a TX pin of the image displaying device. An RS232 cable is typically fed with +/−12 V signals, while a TTL is fed with 0V/5V signals. The signals are preferably digitally and provided by the computer device 203 and by the above described cable computer software, which may hence be arranged to provide signals conformant with RS232, TTL and/or any other digital serial communication specification, as the case may be.

Using such a connection 220 in combination with the above described image signal producing functionality provides for a very versatile usage without having to install additional peripheral equipment, and for a very broad range of image displaying devices.

For instance, the above described remote controlling signals received by the computer device 203 and originating from the portable electronic device 300 may affect either the image signal provided on the plug 202a and/or the signals provided on connection 220, depending on the informational content of the remote controlling signals and the particular image displaying device 133 hardware used. One example is that a volume change initiated by a user of the portable electronic device 300 may either be effected via the plug 202a or the connection 220, or a combination of both, depending on the concrete situation.

Specifically, it is preferred that a received control signal from the portable electronic device 300, such as via the interactive user interface as described above, is used by the cable computer software to both generate a control signal on the connection 220 and also to affect the contents of the image signal provided on plug 202a.

Another example is that the connection 220 may be used for power on/off, as a result of a detection of the local presence of the portable electronic device as described above.

Furthermore, for image displaying devices 131 lacking a serial port input, the IR signal device 222b may be used to fulfil this purpose.

Moreover, by using the IR signal device 222b for receiving signals, a conventional remote control may be used to control the image signals provided on plug 202a. For instance, a channel up/down may affect the selection of image stream produced on plug 202a.

Above, preferred embodiments have been described. However, it is apparent to the skilled person that many modifications can be made to the disclosed embodiments without departing from the basic idea of the invention.

For instance, the database 111 may be used to store the above-described user accounts, and also keep track of users' reservations and so on.

Also, the portable electronic device 300 may also be a laptop computer or similar, which may be internet-connected using a separate ethernet cable.

Furthermore, one single user may be associated in the system 100 with several different portable electronic devices, making it possible to use several such devices as respective remote-controlling device as illustrated in FIG. 3, possibly at the same time when locally located in relation to the cable 200.

The hardware means 203, 210, 212, 214 may be conventional as such, and are therefore not described herein in any further detail. It is especially noted that miniaturized computer and wireless components are readily available on the market, and the power provided by, for instance, PoE is sufficient to power such devices. The cable 200 may, of course, also comprise other additional devices, as long as the overall shape and size being that of a conventional cable is still true.

Everything which has been said regarding the system 100 is equally applicable to the connection method described herein, and vice versa.

Hence, the invention is not limited to the described embodiments, but can be varied within the scope of the enclosed claims.

The invention claimed is:

1. A cable for connecting an image displaying device to a digital computer network, which cable comprises only a first end, arranged to receive a digital network signal, and a second end, arranged to be connected to the image displaying device and deliver a digital image signal to the image displaying device, wherein the cable comprises an integrated general-purpose programmable computer device, arranged to execute a piece of cable computer software in turn arranged to read the network signal and produce said image signal using the said network signal, wherein the computer device is first end is arranged to be physically connected, wherein the cable further comprises a connection for a separate serial communication cable, and wherein the cable computer software is arranged to produce control signals for controlling said image displaying device, and wherein the cable computer device is arranged to provide such signals on said connection.

2. The cable according to claim 1, wherein the digital computer network is an IP network and wherein the network signal is an IP signal.

3. The cable according to claim 2, wherein the said image signal defines a web page to be displayed on the image displaying device.

4. The cable according to claim 2, wherein the first end comprises an Ethernet plug.

5. The cable according to claim 1, wherein the second end comprises a digital image delivery plug, preferably also arranged to deliver digital sound data, such as an HDMI plug.

6. The cable according to claim 1, wherein the cable is further arranged with a wireless internet providing device, arranged to accept wireless connections from portable electronic devices in a local neighbourhood of the cable and to provide wireless internet connectivity to such devices.

7. The cable according to claim 1, wherein the said cable computer software is arranged to produce said image signal so as to present an interactive graphical user interface on said image displaying device.

8. The cable according to claim 7, wherein the user interface is arranged to be controlled by a remote control, emitted wireless signals of which are captured by a wireless signal detection means comprised in the cable and fed to the computer device and processed by said cable computer software.

9. The cable according to claim 7, wherein the cable computer software is arranged to receive, from one of said computer network or a signal receiving means, control signals controlling the interactive user interface, and to update the interactive user interface in reaction to such control signals.

10. The cable according to claim 9, wherein the control signals are initiated by a device computer software executed by or from a portable electronic device in reaction to a manipulation by a user of a touchscreen of the portable electronic device, and wherein the said control signals are transferred to the computer device either via the said network or via a wireless internet connectivity.

11. The cable according to claim 10, wherein the control signals comprise movement descriptors of a graphical pointing means comprised in said interactive graphical user interface.

12. The cable according to claim 11, wherein said movement descriptors are produced in reaction to the user pointing or dragging an object, such as the user's finger, on a touchscreen of said portable electronic device.

13. The cable according to claim 9, wherein the cable comprises a wireless nearfield communication means arranged to be in wireless contact with the portable electronic device so as to identify the portable electronic device, and wherein the cable software is arranged to accept control signals only from portable electronic devices that have previously been identified.

14. The cable according to claim 13, wherein the nearfield communication means is arranged to detect the nearfield presence of a previously identified portable electronic device, and wherein the cable is arranged to then to automatically impart a predetermined change to the image signal as a response to such presence detection.

15. The cable according to claim 14, wherein the identification of the portable electronic device also comprises the identification of a user holding the portable electronic device, and wherein said predetermined change of the image signal is determined based upon the identity of the user in question.

16. A method for connecting an image displaying device to a digital computer network, wherein the method comprises the steps:

a) providing a cable, which cable comprises only a first end, arranged to receive a digital network signal, and a second end, arranged to be connected to the image displaying device and to deliver a digital image signal to the image displaying device, the cable comprising an integrated general-purpose programmable computer device, arranged to execute a piece of cable computer software in turn arranged to read the network signal and produce said image signal using the said network signal, the computer device being arranged to be powered by a voltage provided by an Ethernet socket to which the first end is arranged to be physically connected; the cable further comprising a serial connection for a serial communication cable, the cable computer software being arranged to produce control signals for controlling said image displaying device and the cable computer device being arranged to provide such signals on said connection;

b) connecting the first end of the cable to the digital network;

c) connecting the second end of the cable to the image displaying device;

d) providing a serial communication cable;

e) connecting a first end of the serial communication cable to the said serial connection of the cable; and f) connecting a second end of the serial communication cable to the image displaying device.

\* \* \* \* \*